United States Patent [19]
Harada et al.

[11] Patent Number: 5,497,403
[45] Date of Patent: Mar. 5, 1996

[54] FEEDBACK CLAMPING CIRCUIT

[75] Inventors: Shigeru Harada, Tokyo; Yoshihide Nagatsu, Kanagawa, both of Japan

[73] Assignee: Sony Corporation, Tokyo, Japan

[21] Appl. No.: 916,084

[22] PCT Filed: Dec. 6, 1990

[86] PCT No.: PCT/JP90/01590

§ 371 Date: Jul. 29, 1992

§ 102(e) Date: Jul. 29, 1992

[87] PCT Pub. No.: WO92/10877

PCT Pub. Date: Jun. 25, 1992

[51] Int. Cl.[6] .................................................. H04L 27/08
[52] U.S. Cl. ........................ 375/345; 455/76; 327/73; 327/312; 330/85
[58] Field of Search ........................ 375/98; 455/76; 328/168, 170, 173, 175; 307/359, 540, 546; 330/85

[56] References Cited

U.S. PATENT DOCUMENTS

| | | | |
|---|---|---|---|
| 3,991,370 | 11/1976 | Pate | 328/175 |
| 4,479,253 | 10/1984 | Daniel, Jr. | 375/98 |
| 4,502,079 | 2/1985 | Filliman | 358/27 X |
| 4,536,800 | 8/1985 | Parker | 358/27 X |
| 4,682,211 | 7/1987 | Kaji | 358/34 X |
| 4,751,577 | 6/1988 | Kawai | 358/174 |
| 4,905,255 | 2/1990 | Aalaei | 375/98 |
| 5,057,920 | 10/1991 | Wilkinson | 358/171 X |

FOREIGN PATENT DOCUMENTS

| | | | |
|---|---|---|---|
| 0212068 | 10/1985 | Japan | 375/348 |
| 62-128673 | 11/1987 | Japan | H04N 5/18 |
| 62-128674 | 11/1987 | Japan | H04N 5/18 |
| 63-278471 | 3/1989 | Japan | H04N 5/18 |
| 3014369 | 3/1991 | Japan | H04N 5/18 |
| 3014368 | 3/1992 | Japan | H04N 5/18 |
| 2228643 | 8/1990 | United Kingdom . | |

*Primary Examiner*—Stephen Chin
*Assistant Examiner*—Bryan Webster
*Attorney, Agent, or Firm*—Jay H. Maioli

[57] ABSTRACT

A feedback clamping circuit effects a clamping control by utilizing a digital information or noise detection. Even when a source is a VTR, disc or the like having a large noise amount, a stable clamping operation can be effected by controlling a gain or dead area width of a feedback loop in response to an identified result of a digital control code signal previously involved in an input signal or detected result of a noise amount contained in the input signal.

4 Claims, 6 Drawing Sheets

FIG. 6

| Control Code | 0 | 1 |
|---|---|---|
| 1 | | |
| 2 | | |
| ⋮ | | |
| 19 | B S | Other Source |
| 20 | DISC | VTR |
| ⋮ | | |
| 25 | Small Noise Amount | Large Noise Amount |

FIG. 7

| | Small Noise Amount | Large Noise Amount |
|---|---|---|
| VTR | 10 | 11 |
| DISC | 00 | 01 |

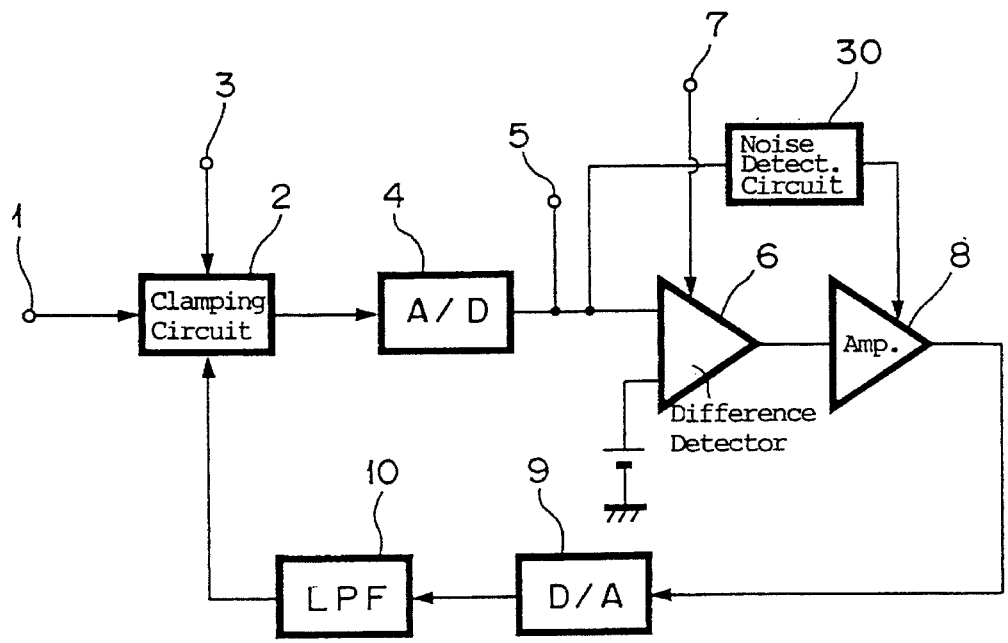
FIG. 8
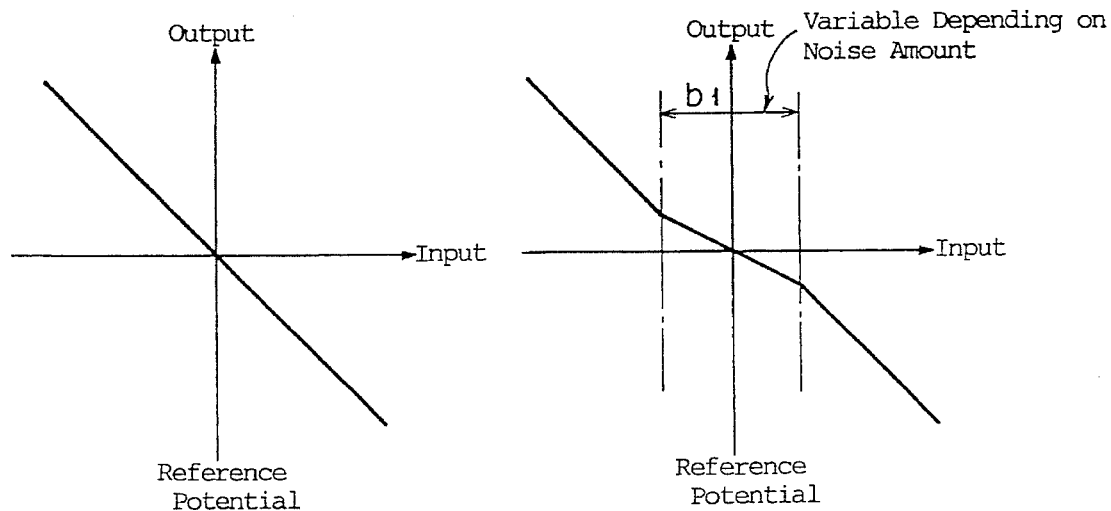
FIG. 9
FIG. 10

FEEDBACK CLAMPING CIRCUIT

TECHNICAL FIELD

The present invention relates to a feedback clamping circuit suitable for processing such as a digital information or the like.

BACKGROUND ART

FIG. 15 shows a conventional digital feedback clamping circuit whose output is processed by an A/D converter. Referring to the figure, an input signal from an input terminal 1 is clamped by a clamping circuit 2 to a predetermined clamping potential during a period of a clamping pulse from a terminal 3. The clamped signal is then A/D-converted by an A/D converter 4 and then fed to an output terminal 5.

A part of the output signal from the A/D converter 4 is supplied to a difference detector 6, in which it is compared with a reference potential (or clamping potential) during a period of a pulse indicative of a reference potential period (or clamping potential period) supplied from a terminal 7. Then, a difference therebetween is amplified by an inverting amplifier 8, D/A-converted by a D/A converter 9 and then supplied through a low-pass filter 10 to the clamping circuit 2 as the clamping potential, thereby effecting a feedback operation such that both inputs to the difference detector 6 become always constant.

In the case of the feedback clamping circuit constructed as shown in FIG. 15, if the gain of the amplifier 8 and the time constant of the low-pass filter 10 in the feedback loop are made constant when the noise amount of the input terminal from the input terminal 1 is large, then the clamping potential applied to the clamping circuit 2 will fluctuate in accordance with the level of the noise. To solve this problem, the gain of the amplifier 8 must be lowered or the time constant of the low-pass filter 10 must be increased, which degrades the clamping capability.

In view of the above aspect, the present invention is to provide a clamping circuit which can effect the stable clamping operation even when a source is a source having a large noise amount.

A feedback clamping circuit according to a first aspect of the present invention comprises an identifying means 20 for identifying a digital control code signal previously involved in an input signal and a gain control means 8 for controlling a gain or dead area width of a feedback loop in response to an output of the identifying means 20, wherein a clamping control is effected by utilizing a digital information.

A feedback clamping circuit according to a second aspect of the present invention comprises a noise detecting means 30 for detecting an amount of noise involved in an input signal and a gain control means 8 for controlling a gain or dead area width of a feedback loop in response to an output of the noise detecting means 30, wherein a clamping control is effected by utilizing a digital information.

According to the first aspect of the present invention, the identifying means 20 identifies the digital control code signal and the gain control means 8 controls the gain or dead area width of the feedback loop in response to the detected output. That is, when the digital control code signal is a code representative of a signal having a poor S/N ratio, a gain decrease area or dead area width is widened in response to the kind of input signal, while when it is a code representative of a signal having an excellent S/N ratio, the gain decrease area or dead area width is narrowed.

Furthermore, according to the second aspect of the present invention, the noise detecting means 30 detects an amount of noise contained in the input signal and the gain control means 8 controls the gain or dead area width of the feedback loop in response to a detected output thereof. That is, when the amount of noise contained in the input signal is large, then the gain decrease area or dead area width is widened, while when it is small, then the gain decrease area or dead area width is narrowed. According to the invention in any of its aspects, even when an input signal having relatively large amount of noise is input to the feedback clamping circuit, the clamping potential can be prevented from fluctuating and stable clamping operation becomes possible.

BRIEF DESCRIPTION OF DRAWINGS

FIGS. 6 and 7 are diagrams used to explain operation of the present invention, respectively, FIG. 8 is a diagram of a circuit configuration showing a second embodiment of the present invention, FIGS. 9 to 12 are graphs of input and output characteristics of an amplifier according to the present invention.

BEST MODE FOR CARRYING OUT THE INVENTION

Embodiments of the present invention will hereinafter be described in detail with reference to FIGS. 1 to 14.

Figure 1:
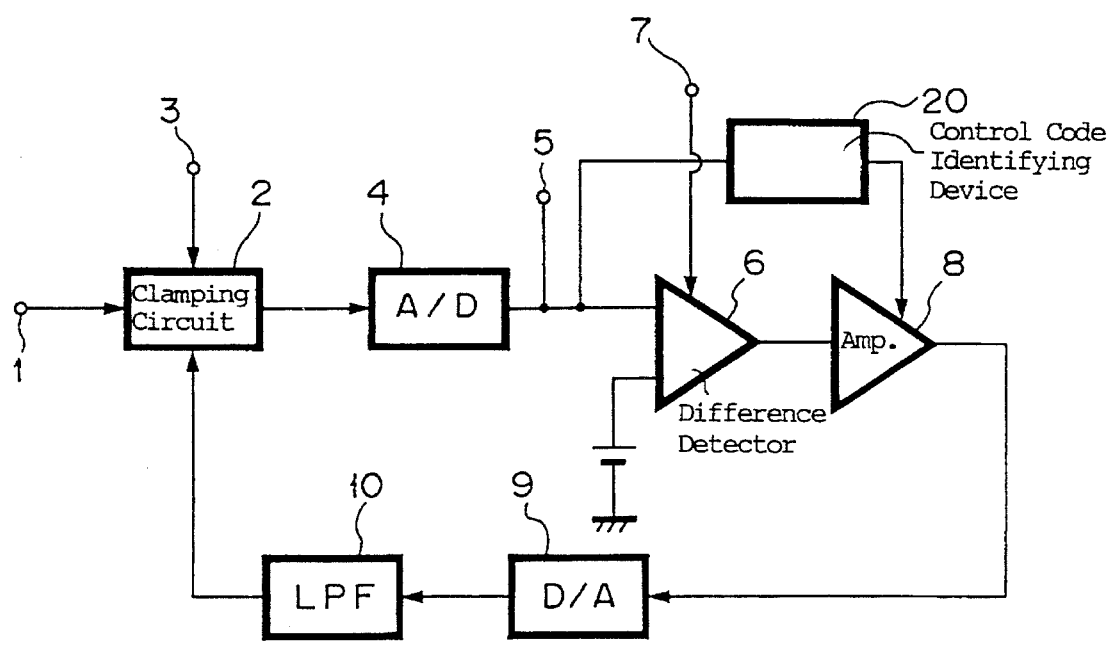
FIG. 1 is a diagram of a circuit configuration showing a first embodiment of the present invention.
Figure 15:
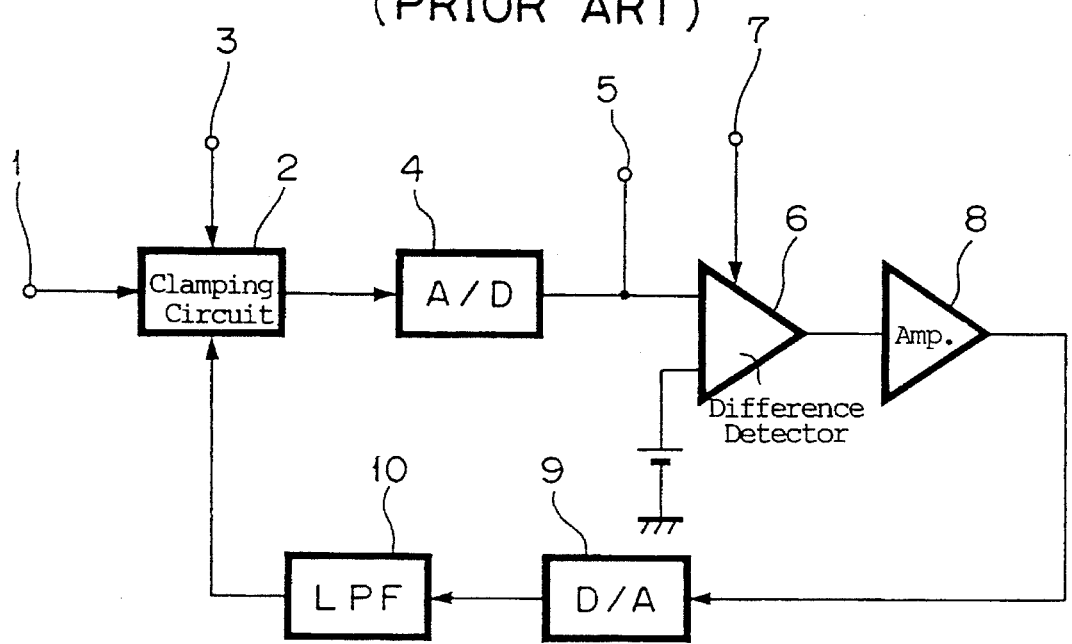
FIG. 15 is a diagram of a circuit configuration showing a conventional example.

FIG. 1 shows a circuit configuration of a first embodiment according to the present invention. In the figure, like parts corresponding to those of FIG. 15 are marked with the same references and therefore need not be described in detail.

According to this embodiment, a control code identifying device 20 is provided at the rear stage of the A/D converter 4 to identify a control code involved in a signal developed at the output side of the A/D converter 4, thereby identifying the kind of the input signal. Then, the gain of the inverting amplifier 8 or the width of the dead band is controlled in response to the identified output. To this end, the input and output characteristic of the inverting amplifier 8 is set in advance in any one of characteristics shown in FIGS. 3 to 5.

Input signals supplied to the input terminal 1 might be a BS broadcasting signal and signals such as those supplied from a VTR, a DISC or the like. Proper control codes are generally allotted to the VTR and the DISC because the signal systems of the latter are different from that of the BS broadcasting. Therefore, the kind of the signals (BS/VTR/DISC) and the signal system can be identified by the control code and the signal processing conforming to the kind of the input signal becomes possible.

FIG. 6 shows an example of the control code. Assuming that the control code, for example, is formed of of successive 25 bits, then it will be appreciated that the BS broadcasting or other source is allotted to 19'th bit. Therefore, if 19'th bit is "0", then the source is the BS broadcasting while if it is "1", then the source is another source. Further, a control code for identifying the source such as the DISC, VTR or the like is allotted to 20'th bit. If it is "0", then the source is the DISC while if it is "1", then the source is the VTR. Furthermore, the 25'th bit is allocated to the control code which is used to identify the noise amount of the source. If it is "0", then the source has a small noise amount while if it is "1", then the source has a large noise amount.

A code allocation shown in FIG. 7, for example, is created on the basis of the control code of FIG. 6, whereby the source and the noise amount can be identified. If 20'th bit, for example, is "1" and 25'th bit is "0", then it will be appreciated that the source is a VTR having a small noise amount and an excellent S/N ratio. If 20'th bit is "1" and 25'th bit also is "1", then it will be appreciated that the source is a VTR having a large noise amount and a poor S/N ratio. Further, if 20'th bit is "0" and 25'th bit also is "0", then it will be appreciated that the source is a DISC having a small noise amount. If 20'th bit is "0" and 25'th bit is "1", then it will be appreciated that the source is a DISC having a large noise amount.

Figure 2:
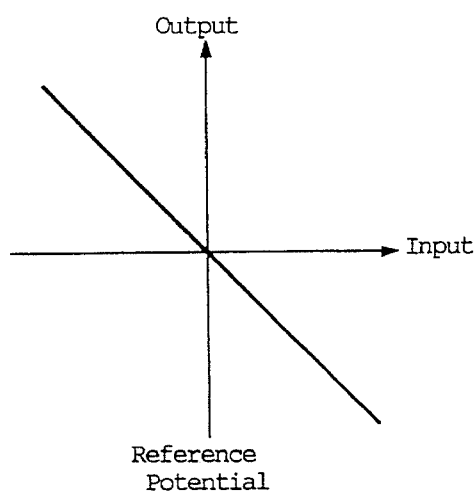
FIGS. 2 to 5 are graphs of input and output characteristics of an amplifier according to the present invention.

Accordingly, since the source is identified as the BS broadcasting if 19'th bit is identified as "0" as a result of the identification of the control code identifying device 20, regardless of the status of other code bit, the input and output characteristic of the inverting amplifier 8 is controlled as shown in FIG. 2. If on the other hand it is determined by the identification that 19'th bit is "1", then the signal processing is carried out in accordance with the code allocation of FIG. 7.

Figure 3:
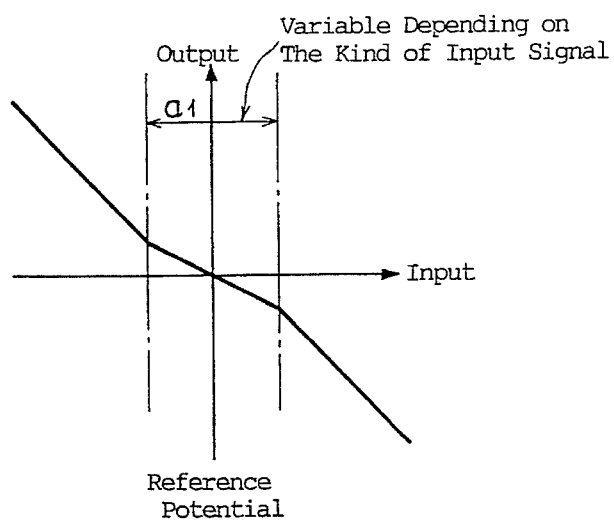

More specifically, when the input and output characteristic of the inverting amplifier 8, for example, is set to the characteristic shown in FIG. 3, if it is determined by the code identifying device 20 that 20'th bit is "1" and 25'th bit is "1", or the code is "11" as shown in FIG. 7, then the source is the VTR having a large noise amount, thereby widening a gain decrease area $a_1$ of FIG. 3. If 20'th bit is "1" and 25'th bit is "0", or the code is "10" as shown in FIG. 7, then the source is the VTR having a small noise amount, thereby narrowing the gain decrease area $a_1$ of FIG. 3. If it is determined by the code identifying device 20 that 20'th bit is "0" and 25'th bit is "1", or the code is "01" as shown in FIG. 7, then the source is the DISC having a large noise amount, thereby widening the gain decrease area $a_1$ of FIG. 3. If 20'th bit is "0" and 25'th bit is "0", or the code is "00" as shown in FIG. 7, then the source is the DISC having a small noise amount, thereby narrowing the gain decrease area $a_1$ of FIG. 3.

Figure 4:
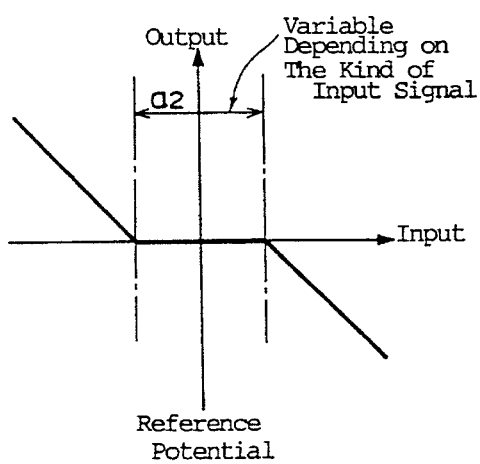

Further, when the input and output characteristic of the inverting amplifier 8, for example, is set to the characteristic shown in FIG. 4, if it is determined by the code identifying device 20 that 20'th bit is "1" and 25'th bit is "1", or the code is "11" as shown in FIG. 7, then the source is the VTR having a large noise amount, thereby widening a dead area width $a_2$ of FIG. 4. If 20'th bit is "1" and 25'th bit is "0", or the code is "10" as shown in FIG. 7, then the source is the VTR having a small noise amount, thereby narrowing the dead area width $a_2$ of FIG. 4. If it is determined by the code identifying device 20 that 20'th bit is "0" and 25'th bit is "1", or the code is "01" of FIG. 7, then the source is the DISC having a large noise amount, thereby widening the dead area width $a_2$ of FIG. 4. If 20'th bit is "0" and 25'th bit is "0", or the code is "00" as shown in FIG. 7, then the source is the DISC having a small noise amount, thereby narrowing the dead area width as of FIG. 4.

Figure 5:
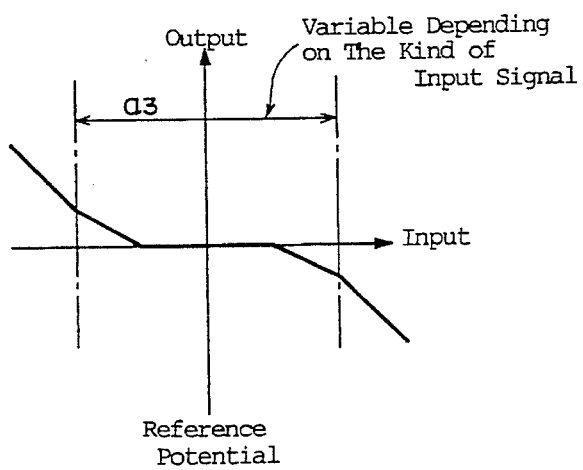

Furthermore, when the input and output characteristic of the inverting amplifier 8, for example, is set to the characteristic shown in FIG. 5, if it is determined by the code identifying device 20 that 20'th bit is "1" and 25'th bit is "1", or the code is "11" as shown in FIG. 7, then the source is the VTR having a large noise amount, thereby widening a gain decrease area and a dead area width $a_3$ of FIG. 5. If 20'th bit is "1" and 25'th bit is "0", or the code is "10" as shown in FIG. 7, then the source is the VTR having a small noise amount, thereby narrowing the gain decrease area and the dead area width $a_3$ of FIG. 5. If it is determined by the code identifying device 20 that 20'th bit is "0" and 25'th bit is "1", or the code is "01" as shown in FIG. 7, then the source is the DISC having a large noise amount, thereby widening the gain decrease area and the dead area width $a_3$ of FIG. 5. If 20'th bit is "0" and 25'th bit is "0", or the code is "00" as shown in FIG. 7, then the source is the DISC having a small noise amount, thereby narrowing the gain decrease area and the dead area width $a_3$ of FIG. 5.

The output signal from the inverting amplifier 8 whose gain or dead area width is controlled as described above is D/A-converted by the D/A converter 9 and supplied through the low-pass filter 10 to the clamping circuit 2 as the clamping potential. Thus, even when an input signal having a relatively large noise amount is input to this clamping circuit, the clamping potential can be prevented from fluctuating and the stable clamping operation can be effected.

FIG. 8 shows a circuit configuration of a second embodiment according to the present invention and the present invention will be described with reference to FIG. 8. In the figure, like parts corresponding to those of FIG. 15 are marked with the same references and therefore need not be described in detail.

According to this embodiment, a noise detecting circuit 30 is provided at the rear stage of the A/D converter 4 to detect a noise amount of a signal developed at the output side of the A/D converter 4. Then, the gain of the inverting amplifier 8 or the width of the dead area is controlled in response to the detected output of the noise detecting circuit. To this end, the input and output characteristic of the inverting amplifier 8 is set to any one of the characteristics shown in FIGS. 10 to 12.

If the input and output characteristic of the inverting amplifier 8 is set to the characteristic shown in FIG. 10, then when the amount of noise detected by the noise detecting circuit 30 is zero, the input and output characteristic of the inverting amplifier 8 is presented as shown in FIG. 9. However, when the noise amount is detected by the noise detecting circuit 30, then the input and output characteristic of the inverting amplifier 8 is changed in response to the noise amount as shown in FIG. 10. That is, the increase of the noise amount detected widens a gain decrease area $b_1$ while the decrease of the detected noise amount narrows the gain decrease area $b_1$.

Figure 11:
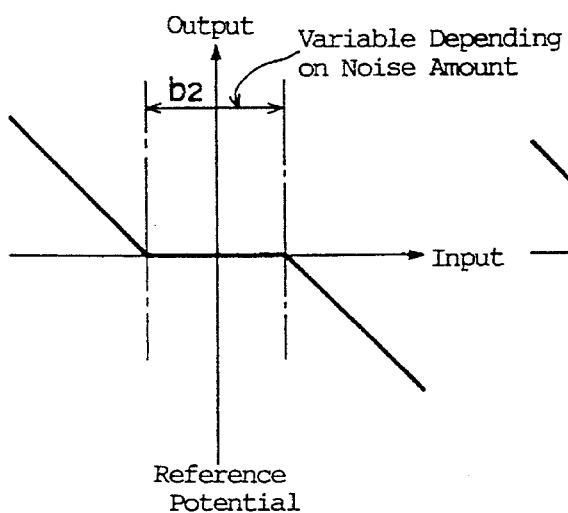

Further, if the input and output characteristic of the inverting amplifier 8 is set to the characteristic shown in FIG. 11, then when the amount of noise detected by the noise detecting circuit 30 is zero, the input and output characteristic of the inverting amplifier 8 is presented as shown in FIG. 9. However, when the noise amount is detected by the noise detecting circuit 30, the input and output characteristic of the inverting amplifier 8 is changed in response to the noise amount as shown in FIG. 11. That is, the increase of the amount of noise detected widens a dead area width $b_2$ while the decrease of noise detected narrows the dead area width $b_2$.

Figure 12:
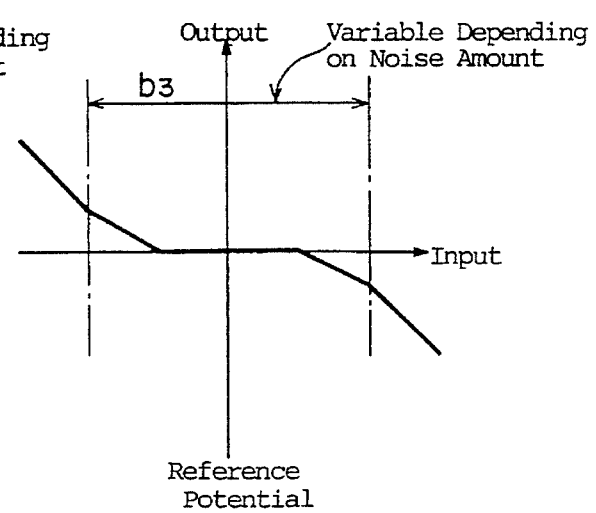

Further, if the input and output characteristic of the inverting amplifier 8 is set to the characteristic shown in FIG. 12, then when the amount of noise detected by the noise detecting circuit 30 is zero, the input and output characteristic of the inverting amplifier 8 is presented as shown in FIG. 9. However, when the noise amount is detected by the noise detecting circuit 30, the input and output characteristic of the inverting amplifier 8 is changed in response to the noise amount as shown in FIG. 12. That is, the increase of the amount of noise detected widens a gain decrease area and the dead area width $b_3$ while the decrease of the amount of noise detected narrows the gain decrease area and the dead area width $b_3$.

As described above, also in this embodiment, the output signal from the inverting amplifier 8 whose gain or dead area width is controlled is D/A-converted by the D/A converter 9 and then supplied through the low-pass filter 10 to the clamping circuit 2 as the clamping potential. Thus, even when an input signal having relatively much noise is input to this feedback clamping circuit, the clamping potential can be prevented from fluctuating and the stable clamping operation can be effected.

Figure 13:
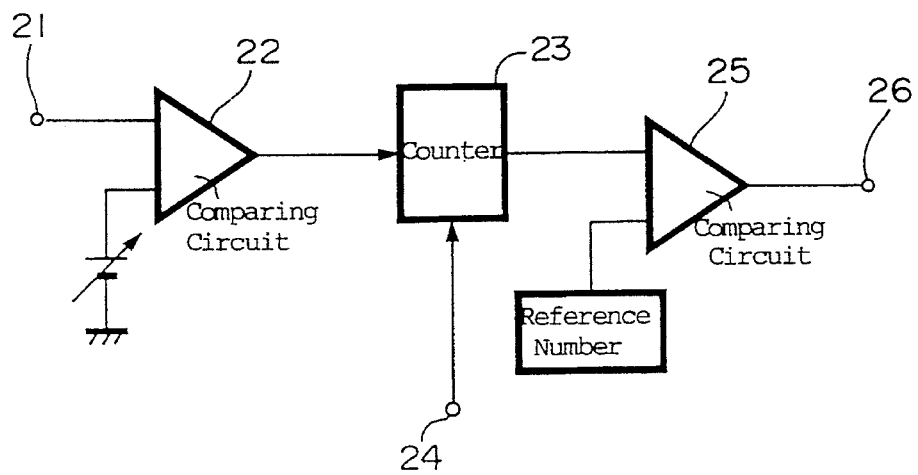
FIG. 13 is a block diagram showing an example of a main portion of the present invention.

FIG. 13 shows an example of a practical circuit of the noise detecting circuit 30. In the figure, reference numeral 21 designates an input terminal to which there is supplied the output signal from the A/D converter 4 (FIG. 8). The input signal from the input terminal 21 is supplied to and compared with the reference potential by a comparing circuit 22. The comparing circuit 22 generates a signal "1", for example, when the level of the input signal is larger than the reference potential or a signal "0", for example, when the level of the input signal is smaller than the reference potential.

An output signal from the comparing circuit 22 is supplied to a counter 23 and the counter 23 counts the signal "1" from the comparing circuit 22 during a period of a pulse indicative of the reference potential period applied thereto from a terminal 24. A count value of the counter 23 is supplied to and compared with a reference number by a comparing circuit 25. If the count value is larger than the reference number, then a noise amount detected signal is developed at an output terminal 26.

Figure 14:
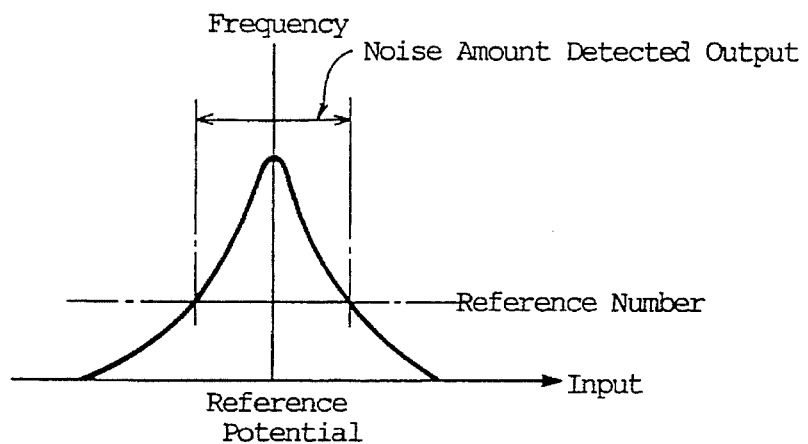
FIG. 14 is a diagram used to explain operation of FIG. 13.

FIG. 14 is a graph showing a relation between the reference number and a frequency of the input signal during the reference potential period. To the extent that the count value of the counter 23 exceeds the reference number, the noise amount detected output can be obtained.

As described above, according to the present invention, the gain or dead area width of the feedback loop is controlled in response to the identified result of the digital control code previously involved in the input signal or the detected result of the noise amount so that, even when the source is the source such as the VTR, disc or the like having a large noise amount, this feedback clamping circuit can effect the stable clamping operation. Therefore, this feedback clamping circuit is considerably useful in the processing such as when a digital information is processed.

The present invention is not limited to the above embodiments and can take various arrangements without departing from the gist of the present invention.

EXPLANATION OF REFERENCE NUMERALS

Reference numeral 2 represents the clamping circuit, 4 the A/D converter, 6 the difference detector, 8 the amplifier, 9 the D/A converter, 10 the low-pass filter, 20 the control code identifying device, and 30 the noise detecting circuit.

We claim:

1. A feedback clamping circuit comprising:

a clamping circuit receiving an input signal having a noise component contained therein;

a detector circuit responsive to a signal having the noise component contained therein from said clamping circuit for detecting information relating to said noise component and generating an output signal containing said information, wherein said detector circuit comprises a noise detector circuit for detecting the level of noise in said output signal from said clamping circuit; and a gain control circuit receiving said output signal of said detector circuit for controlling a gain of a feedback loop formed from an output of said gain control circuit fed to a clamping level control input of said clamping circuit in response to a detected level of noise in from said detector circuit, wherein said clamping circuit is responsive to said output of said gain control circuit for clamping said input signal.

2. A feedback clamping circuit comprising:

a clamping circuit receiving an input signal having a noise component contained therein;

a detector circuit responsive to a signal having the noise component contained therein output from said clamping circuit for detecting information relating to said noise component and generating an output signal containing said information, wherein said detector circuit comprises a noise detector circuit for detecting the level of noise in said output signal from said clamping circuit; and a gain control circuit receiving said output signal of said detector circuit for controlling a dead area width of a feedback loop formed from an output of said gain control circuit fed to a clamping level control input of said clamping circuit in response to a detected level of noise from said detector circuit, wherein said clamping circuit is responsive to said output of said gain control circuit for clamping said input signal.

3. A feedback clamping circuit comprising:

a clamping circuit receiving an input signal including a noise component and a control code indicative of a signal-to-noise ratio of said input signal;

a detector circuit responsive to a signal having the noise component contained therein output from said clamping circuit for detecting information relating to said noise component and generating an output signal containing said information, wherein said detector circuit comprises a control code identifying circuit for detecting said control code indicative of the signal-to-noise ratio in said input signal; and a gain control circuit receiving said output signal from said detector clamping circuit for controlling a gain of a feedback loop formed from an output of said gain control circuit fed to a clamping level control input of said clamping circuit in response to a detected control code from said control code identifying circuit, wherein said clamping circuit is responsive to said output of said gain control circuit for clamping said input signal.

4. A feedback clamping circuit comprising:

a clamping circuit receiving an input signal including a noise component and a control code indicative of a signal-to-noise ratio of said input signal;

a detector circuit responsive to a signal having the noise component contained therein output from said clamping circuit for detecting information relating to said noise component and generating an output signal containing said information, wherein said detector circuit comprises a control code identifying circuit for detecting said control code indicative of the signal-to-noise ratio in said input signal; and a gain control circuit receiving said output signal from said detector circuit for controlling a dead area width of a feedback loop formed of an output from said gain control circuit fed to a clamping level control input of said clamping circuit in response to a detected control code from said control code identifying circuit, wherein said clamping circuit is responsive to said output of said gain control circuit for clamping said input signal.

* * * * *

UNITED STATES PATENT AND TRADEMARK OFFICE
CERTIFICATE OF CORRECTION

PATENT NO. : 5,497,403
DATED : March 05, 1996
INVENTOR(S) : Shigeru Harada & Yoshihide Nagatsu It is certified that error appears in the above-identified patent and that said Letters Patent is hereby corrected as shown below:

Col.3, line 63, change "as" to --$a_2$--

<u>In the Claims</u>:

Col.6, line 52, delete "clamping"

Signed and Sealed this

Twenty-fifth Day of November, 1997

Attest:

BRUCE LEHMAN

*Attesting Officer*  *Commissioner of Patents and Trademarks*